United States Patent
Ikeuchi

(10) Patent No.: US 7,264,405 B2
(45) Date of Patent: Sep. 4, 2007

(54) OPTICAL MODULE

(75) Inventor: Tadashi Ikeuchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/017,846

(22) Filed: Dec. 22, 2004

(65) Prior Publication Data

US 2006/0062526 A1    Mar. 23, 2006

(30) Foreign Application Priority Data

Sep. 17, 2004    (JP)    ............... 2004-271448

(51) Int. Cl.
G02B 6/36    (2006.01)
(52) U.S. Cl. .................. 385/88; 385/92; 385/53
(58) Field of Classification Search .......... 385/88, 385/92

See application file for complete search history.

(56) References Cited

U.S. PATENT DOCUMENTS

| | | | | |
|---|---|---|---|---|
| 6,425,691 | B1 * | 7/2002 | Demangone ............. | 385/53 |
| 6,817,782 | B2 * | 11/2004 | Togami et al. .......... | 385/92 |
| 2003/0142929 | A1 * | 7/2003 | Bartur et al. .......... | 385/92 |
| 2004/0120660 | A1 * | 6/2004 | Go et al. .............. | 385/92 |
| 2004/0207991 | A1 * | 10/2004 | Oki et al. ............. | 361/797 |
| 2004/0264882 | A1 * | 12/2004 | Torigoe et al. ......... | 385/88 |
| 2006/0028926 | A1 * | 2/2006 | Terada et al. .......... | 369/13.17 |
| 2006/0030781 | A1 * | 2/2006 | Shennib ............... | 600/509 |

FOREIGN PATENT DOCUMENTS

| | | |
|---|---|---|
| JP | 62019812 | 1/1987 |
| JP | 2002-353471 | 12/2002 |
| JP | 2003-249711 | 9/2003 |

\* cited by examiner

*Primary Examiner*—Frank G. Font
*Assistant Examiner*—Eric Wong
(74) *Attorney, Agent, or Firm*—Bingham McCutchen LLP

(57) ABSTRACT

An optical module of the present invention comprises first and second optical devices, a circuit board for outer connection, and a flexible substrate on which a part or all of an electronic circuit device group for each of the optical devices is mounted to electrically connect each of the optical devices to the circuit board for outer connection, wherein the flexible substrate has first and second substrate parts which are separated by a slit part that is elongated from an interspace between connection parts of the first and the second optical devices in a longitudinal direction of the flexible substrate. With this configuration, it is possible to provide an optical module capable of sufficiently and easily absorbing a positional deviation of a connection portion between an optical device and that of a print circuit board and capable of decreasing a cross talk between transmission and reception.

11 Claims, 11 Drawing Sheets

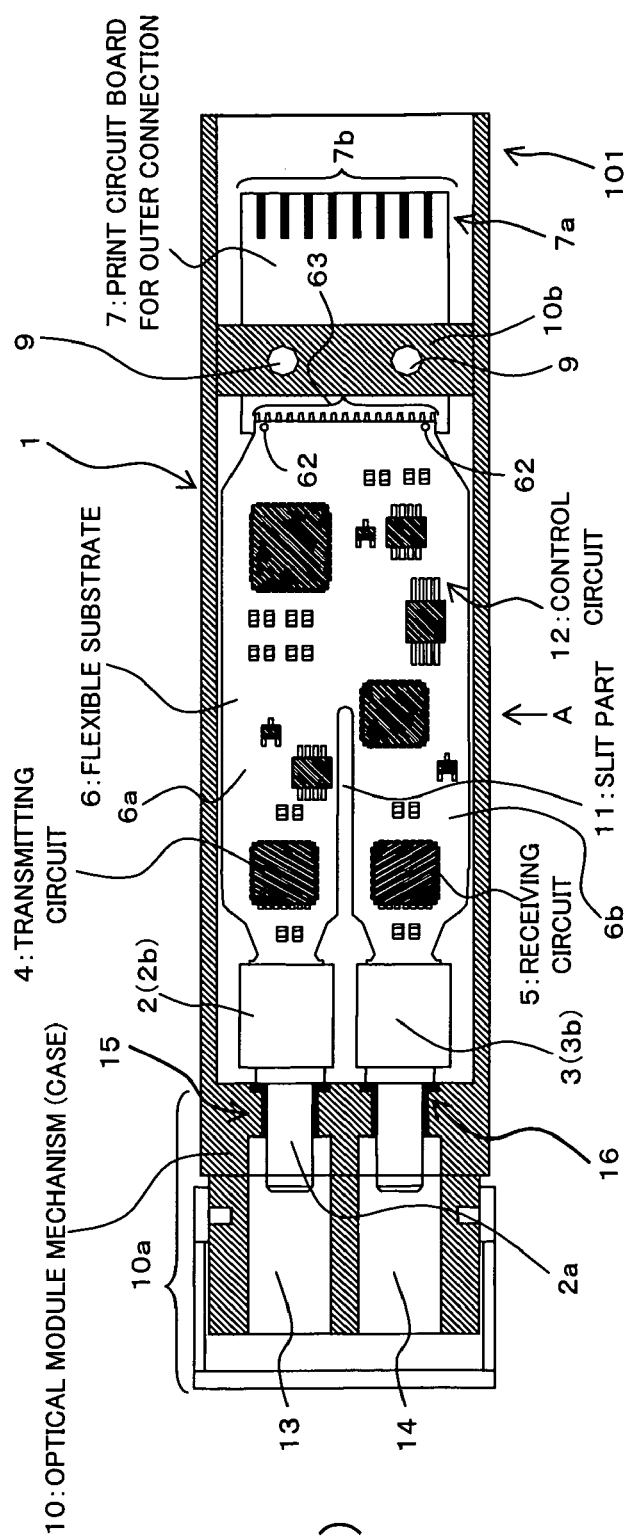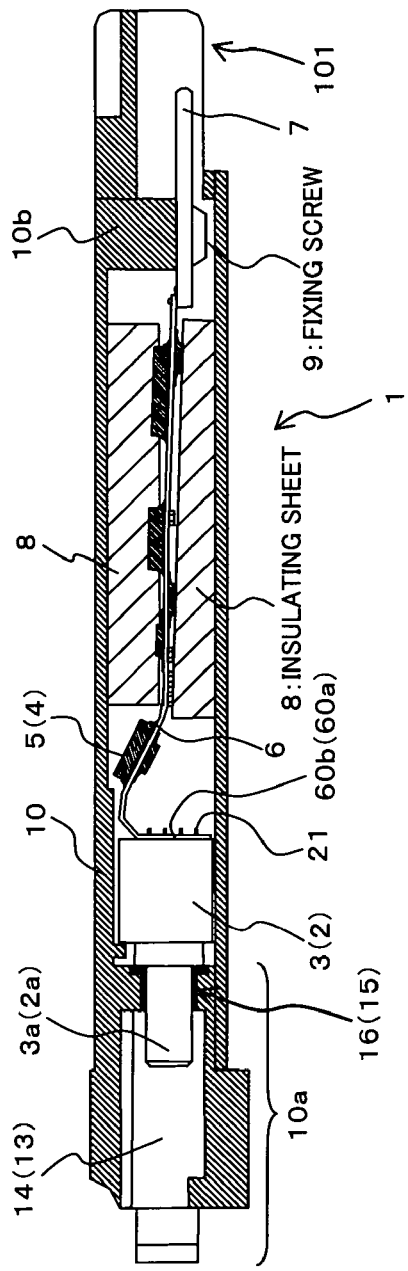
FIG. 1(A)
FIG. 1(B)

COAXIAL PACKAGE

CERAMIC TERMINAL PACKAGE

CONFIGURATION OF FLEXIBLE SUBSTRATE

62: ELECTRODE FOR FIXING SUBSTRATE

17: SOLDERING
CHIP DEVICE IC
64: ELECTRODE
6: FLEXIBLE SUBSTRATE

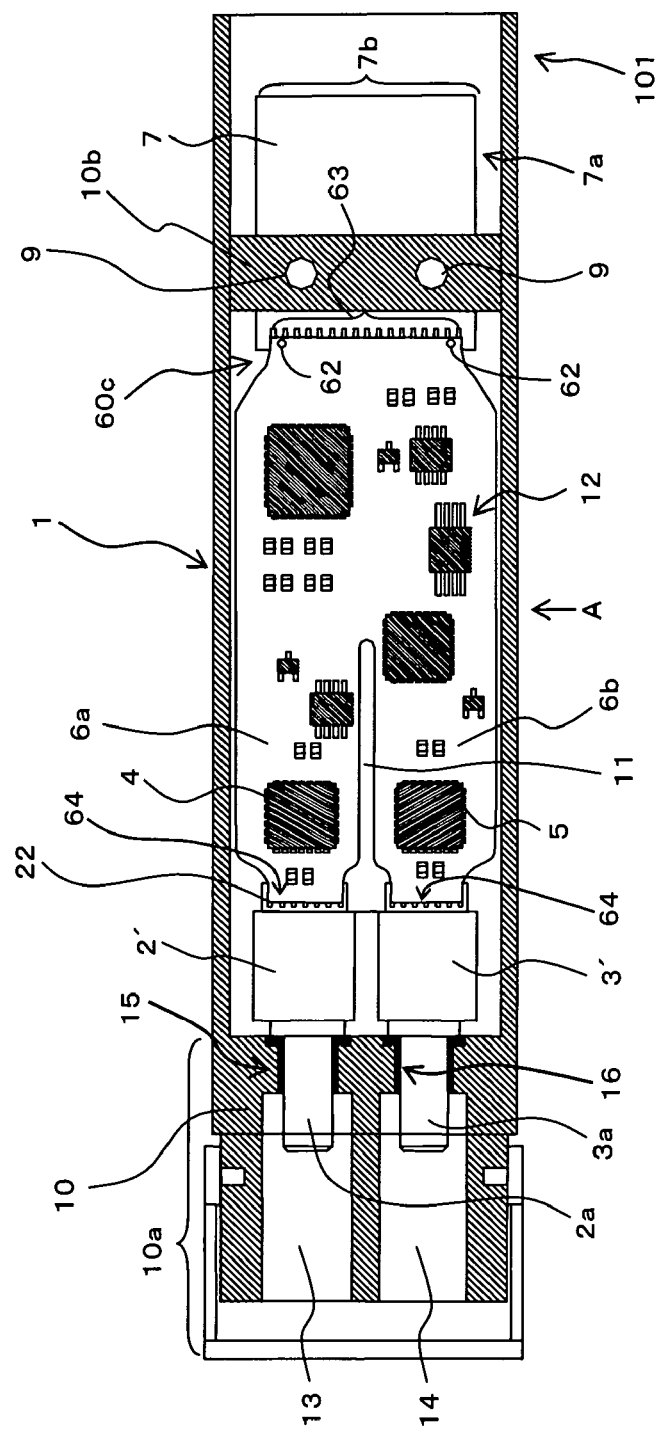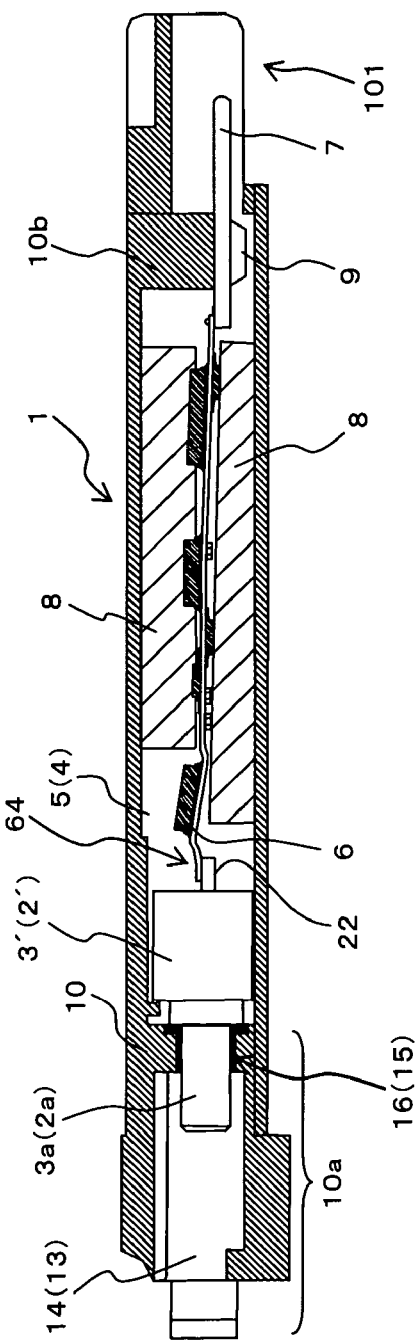
FIG. 4(A)
FIG. 4(B)

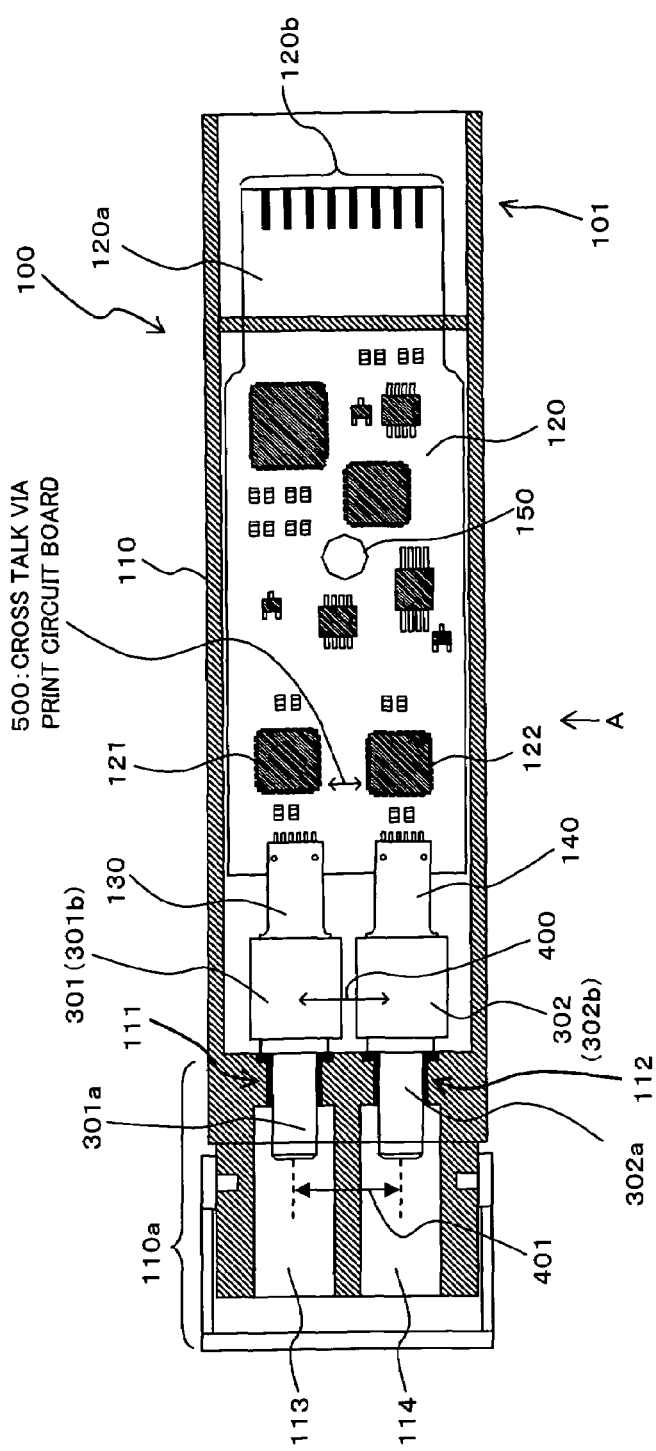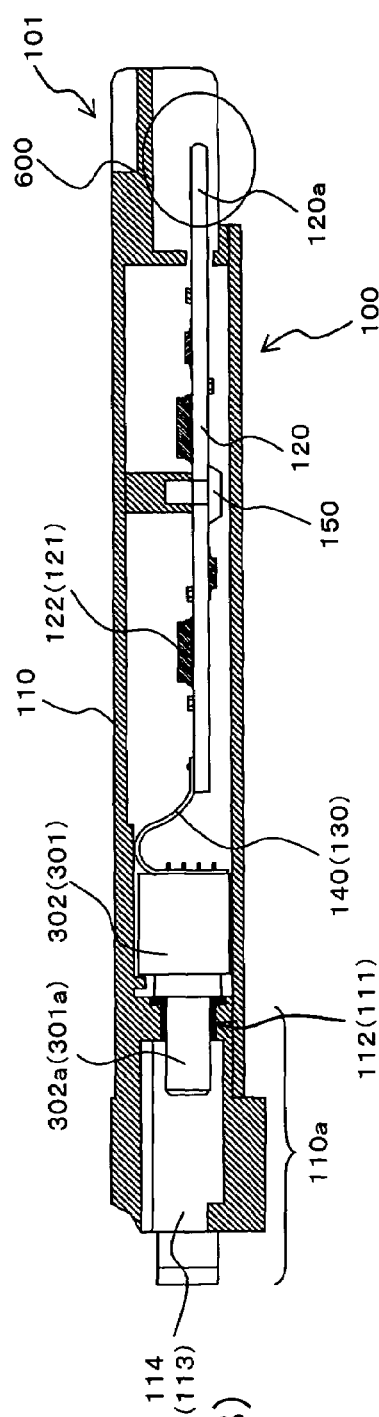
FIG. 10(A) PRIOR ART
FIG. 10(B) PRIOR ART

OPTICAL MODULE

CROSS REFERENCE TO RELATED APPLICATIONS

This application is based on and hereby claims priority to Japanese Application No. 2004-271448 filed on Sep. 17, 2004 in Japan, the contents of which are hereby incorporated by reference.

BACKGROUND OF THE INVENTION (1) Field of the Invention

The present invention relates to an optical module, for example, the present invention relates to an art that is preferably used for an optical module for pluggable optical communication serving to transmit and receive mainly a signal not less than 10 Gb/s (giga bit per second).

(2) Description of the Related Art

In a transceiver module for optical communication, as a mode that is compact and can be easily replaced, a plugable module having both of optical and electric connecter interfaces (IF) is required. FIG. 11 shows an external view of an entire XFP module in conformity with an XFP (10 Gigabit small Form Factor Pluggable)—MSA (Multi-Source Agreement), which is one of conventional pluggable transceiver modules.

In this FIG. 11, a reference numeral 100 denotes an XFP module and the XFP module 100 is detachably mounted on a host board (also referred to as a mother board) 200 by inserting a plug portion 101 of the XFP module 100 into a connector interface 201a of a cage part 201 to be mounted on the mother board 200 through an opening portion 205 that is provided on a bezel part 204 of the mother board 200l. In addition, at one end opposite to the plug portion 101 of the XFP module 100, a receptacle part 110a with connector holes 113 and 114 into which an optical connector plug for an optical fiber is detachably inserted and connected is provided. In the meantime, in FIG. 11, a reference numeral 202 denotes a heat sink for cooling the cage part 201, and a reference numeral 203 denotes a clip for fixing this heat sink 202 on the cage part 201, respectively, and in FIG. 11, these cage part 201, heat sink 202, and clip 203 are decomposed.

Then, FIG. 10(A) is a schematic plan view showing an inner structure of the above-described XFP module 100. FIG. 10(B) is an A arrow side view in FIG. 10(A). Also described in patent documents 1 and 2 to be described later, the XFP module 100 shown in FIGS. 10(A) and 10(B) is configured so as to include an optical transmitting device (TOSA: Transmitter Optical Sub-Assembly) 301, an optical receiving device (ROSA: Receiver Optical Sub-Assembly) 302, and a print circuit board 120 in a case (an optical module mechanism) 110 having a receptacle part 110a in which the above-described connector holes 113 and 114 are formed as its basic construction.

The optical transmitting device 301 has a photoelectric conversion element such as a laser diode (LD) or the like, and the optical receiving device 302 has a photoelectric conversion element such as a photo diode (PD) or the like. Both of them are structured as a CAN type (a coaxial package) device or the like having an optical connecter interface in place of an optical fiber. These optical transmitting device 301 and optical receiving device 302 are fixed by a bonding agent or the like to optical device support and fixing parts 111 and 112 in which respective neck portions 301a and 302a are arranged in parallel on the same plane in the receptacle part 110a so as to be fixed in the case 110 while securing a center accuracy by the necessity to secure the center accuracy (a positional tolerance not more than ±25 μm: refer to an arrow 400 in FIG. 10(A)) of the optical connector interface.

The print circuit board 120 has a width that is slightly shorter than the width of the case 110 and a length that is slightly longer than the length from a position in adjacent to an end surface opposed to the neck portions 301a and 302a of the above-described respective optical devices 301 and 302 to the plug portion 101 of the case 110. On a surface of the print circuit board 120, an electronic circuit device group including a transmitting circuit (IC chip) 121 for the optical transmitting device 301 and a receiving circuit (IC chip) 122 for the optical receiving device 302 or the like is appropriately mounted.

This print circuit board 120 is positioned and fixed at a predetermined position in the case 110 by a fixing screw 150. In this case, the end portion at the side of the plug portion 101 of the print circuit board 120 served as a card edge connecter part 120a to be inserted and connected into the connector interface 201a of the above-described cage part 201, so that the tolerance of the outside dimension of the print circuit board 120 is needed to be, for example, not more than ±50 μm (refer to a reference numeral 600 of FIG. 10(B)).

In the meantime, in the card edge connecter part 120a, a wiring 120b for supplying a power source from the side of the mother board 200 to the print circuit board 120 and for transmitting and receiving a signal between the print circuit board 120 and the mother board 200 is formed. In addition, in FIG. 10(B), in order to make connection operation with respective optical devices 301 and 302 easily, it is general that the print circuit board 120 is fixed so as to be located lower than a plane including center axes of respective optical devices 301 and 302.

On the other hand, the end portions at the sides of respective optical transmitting device 301 and optical receiving device 302 of the print circuit board 120 are connected to the optical devices 301 and 302 by flexible substrates 130 and 140, and thereby, the optical transmitting device 301 is electrically connected with the optical transmitting circuit 121, and further, the optical receiving device 302 is electrically connected with the optical receiving circuit 122. In the meantime, in FIG. 10(B), respective end portions of the flexible substrates 130 and 140 are directly connected to the end surfaces of the optical transmitting device 301 and the optical receiving device 302, however, as shown in FIG. 7 and FIG. 15 of the patent document 2, respective end portions of the flexible substrates 130 and 140 may be indirectly connected to the end surfaces of the optical transmitting device 301 and the optical receiving device 302 via a ceramic substrate for connection of a flexible substrate that is provided at the sides of respective optical devices 301 and 302.

Thus, by using the flexible substrates 130 and 140 to connect respective optical devices 301 and 302 with the print circuit board 120, a signal of 10 Gb/s is transmitted on a transmission line formed on the flexible substrate 120, so that it is possible to realize connection with less deterioration of waveform. In addition, it is also possible to absorb a positional deviation in a longitudinal direction between the optical devices 301, 302 and the print circuit board 120 (each of the tolerance of the outside dimension of the print circuit board 120 and the optical device 301, 302) by flexibility of the flexible substrate 120.

In addition, according to an prior art proposed by the following patent document 3 (an optical transmission module incorporated active connector), it is described that the flexible print circuit having an electric part such as a resistance, a transmission IC, and a reception IC or the like mounted thereon is mounted with bent in a predetermined shape in a cylindrical case. Therefore, on the flexible print circuit board described in the patent document 3, cutting and score are provided so as to be bent at a predetermined shape.

Japanese Patent Laid-Open No. 2002-353471
Japanese Patent Laid-Open No. 2003-249711
Japanese Patent Laid-Open No. SHO62-019812

However, according to the module structure described above with reference to FIG. 10(A) and FIG. 10(B), it is possible in some degree to secure the tolerance of the outside dimension of the print circuit board (not more than ±50 µm: refer to a reference numeral 600 in FIG. 10(B)) by absorbing the positional deviation in a longitudinal direction in the optical module mechanism 110 with the flexible substrates 130 and 140, however, as shown by two-head arrow 400 in FIG. 10(A), if deviation not less than ±400 µm at an interval between the optical devices 301 and 302 is generated due to the coaxial deviation of the optical devices 301 and 302 (the positional deviation of the neck portions 301a, 302a and coaxial portions 301b, 302b), it becomes very difficult to correct the position (to absorb the positional deviation) at the flexible substrates 130 and 140. In addition, due to a large size of the print circuit board 120 (it shares a large portion of a mounted area in the case 110), it is also difficult to realize the positional accuracy of the print circuit board 120 and the optical devices 301, 302.

In other words, according to such conventional structure, since it is not possible to absorb the positional deviation (the positional deviation in a twist direction) due to the positional deviation in a width direction of the optical module mechanism 110 of respective optical devices 301, 302 and the print circuit board 120; the rotations about center axes of the coaxial portions 301b and 302b of the optical devices 301 and 302; and the deviation of the print circuit board 120 in the optical module mechanism 110 or the like, it is difficult to secure the enough positional accuracy. As a result, it takes a long period of time for a module assembling step. This is the same as the structure that is proposed in the patent documents 1 to 3.

In addition, according to the structure to connect the optical devices 301, 302 with the print circuit board 120 by the flexible substrates 130 and 140, due to absorption of the above-described positional deviation in a longitudinal direction, there is a limitation in making connection lengths between the optical transmitting device 301 and the optical transmitting circuit 121 and between the optical receiving device 302 and the optical receiving circuit 122. When treating a super fast signal not less than 40 Gb/s, a deviation occurs in a waveform of transmitted and received signals to cause deviation of optical transmitted and received properties. Further, the optical transmitting circuit 121 and the optical receiving circuit 122 are mounted on the same print circuit board 120, so that this involves a problem that a cross talk between transmission and reception via the print circuit board 120 is generated (refer to a reference numeral 500 in FIG. 10(A)) to deteriorate the reception sensitivity.

SUMMARY OF THE INVENTION

The present invention has been made taking the foregoing problems into consideration and an object of which is to provide an optical module capable of sufficiently and easily absorbing a positional deviation of a connection portion between an optical device and that of a print circuit board and capable of decreasing a cross talk between transmission and reception.

In order to attain the above-descried object, the optical module of the present invention may comprise first and second optical devices, a circuit board for outer connection, and a flexible substrate on which a part or all of an electronic circuit device group for each of the optical devices is mounted to electrically connect each of the optical devices to the circuit board for outer connection; wherein the flexible substrate having a first flexible substrate part and a second flexible substrate part which are separated by a slit part that is elongated from an interspace between a connection part of the first optical device and a connection part of the second optical device in a longitudinal direction of the flexible substrate.

In this case, it is preferable that an electronic circuit device for the first optical device is mounted on the first flexible substrate part that is connected to the first optical device. In addition, it is preferable that an electronic circuit device for the second optical device is mounted on a second flexible substrate part that is is connected to the second optical device.

Further, it is preferable that the first optical device is configured as an optical transmitting device and the second optical device is configured as an optical receiving device, and a transmitting circuit for the optical transmitting device is provided as the electronic circuit device at the first flexible substrate part and an optical receiving circuit for the optical receiving device is provided as the electronic circuit device at the second flexible substrate part.

In addition, it is preferable that a part with a narrow substrate width is provided in the middle of the flexible substrate.

According to the above-described present invention, by the flexible substrate on which a part or all of an electronic circuit device group for the above-described each of the optical devices is mounted, each of the optical devices is electrically connected to the circuit board for outer connection, and this flexible substrate has the flexible substrate part and the second flexible substrate part which are separated by a slit part that is elongated from an interspace between the connection part of the above-described each optical device in a longitudinal direction of the flexible substrate. Therefore, it is possible to easily secure a positional accuracy of the circuit board for outer connection and further, it is possible to easily absorb the positional deviation between the above-described respective optical devices.

In addition, the electronic circuit device for each optical device (for example, the transmitting circuit and the receiving circuit) can be mounted on the flexible substrate part that is separated at the above-described slit part with spaciously divided, so that it is possible to decrease the cross talk between the both electronic circuit devices (between transmission and reception).

Further, if a part with a narrow substrate width is provided in the middle of the flexible substrate, it is possible to improve a plastic property at this part, so that it is possible to more easily realize a predetermined positional accuracy.

BRIEF DESCRIPTION OF THE DRAWINGS

FIG. 1(A) is a schematic plan view showing an inner structure of an optical transceiver module (an XFP module) according to a first embodiment of the present invention;

FIG. 1(B) is an A arrow side view in FIG. 1(A);

FIG. 4(A) is a schematic plan view showing an inner structure of a first modification of the XFP module shown in FIG. 1;

FIG. 4(B) is an A arrow side view in FIG. 4(A);

FIG. 10(A) is a schematic plan view showing an inner structure of a conventional XFP module;

FIG. 10(B) is an A arrow side view in FIG. 10(A); and

Figure 2A:
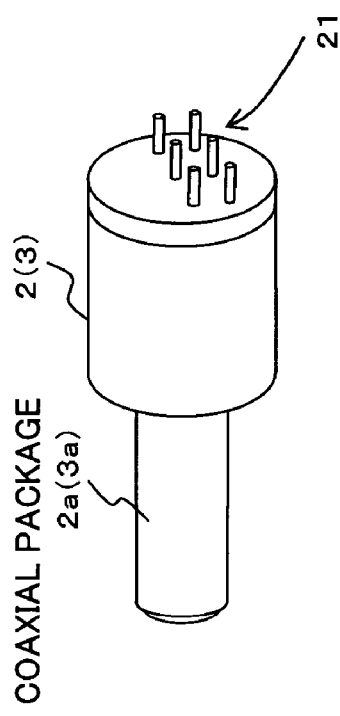
FIG. 2(A) is a schematic external view of an optical device (a coaxial package device) shown in FIG. 1.

DESCRIPTION OF THE PREFERRED EMBODIMENTS (A) Description of a First Embodiment

FIG. 1 is a schematic view showing an inner structure of an optical transceiver module (an XFP module) according to a first embodiment of the present invention. Specifically, FIG. 1(A) is a schematic plan view showing an inner structure of the XFP module, and FIG. 1(B) is an A arrow side view in FIG. 1(A). An XFP module 1 shown in this FIG. 1 is also detachably inserted and connected from the plug portion 101 into, for example, to the above-described connector interface 201a of the mother board 200 (a cage part 201) with reference to FIG. 10. The XFP module 1 is configured so as to include an optical transmitting device (TOSA) 2, an optical receiving device (ROSA) 3, a flexible substrate 6, and a print circuit board for outer connection (a substrate for outer connection) 7 in a case (an optical module mechanism) 10 having a receptacle part 10a in which connector holes 13 and 14 into which an optical connector plug for an optical fiber is inserted detachably are formed as its basic construction. In the meantime, a size of the XFP module 1 is about 7 cm (L)×2 cm (W)×1 cm (H).

Figure 2B:
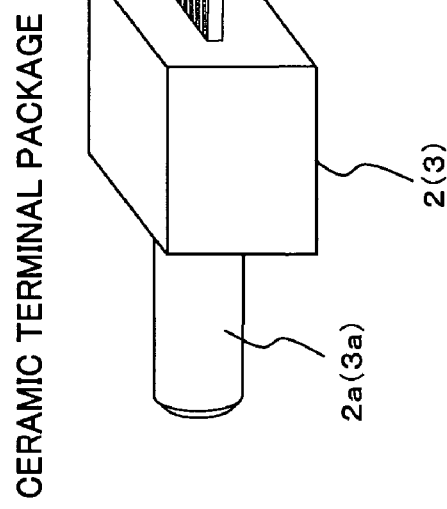
FIG. 2(B) is a schematic external view of an optical device (a ceramic terminal package device) shown in FIG. 1.

In this case, also according to the present embodiment, an optical transmitting device (a first optical device) 2 has a photoelectric conversion element such as a laser diode (LD) or the like, and an optical receiving device (a second optical device) 3 has a photoelectric conversion element such as a photo diode (PD) or the like. Both of them are structured as a CAN type (a coaxial package) device [refer to FIG. 2(A)] and a ceramic terminal package device [refer to FIG. 2(B)] or the like having an optical connecter interface in place of an optical fiber. The former outer connection terminal is, for example, a lead pin 21 as shown in FIG. 2(A) and the latter outer connection terminal is, for example, a card edge-like ceramic terminal 22 as shown in FIG. 2(B), however, as a matter of course, a configuration of the outer connection terminal is not limited to this. FIGS. 1(A) and 1(B) each shows a structure in which a coaxial package device shown in FIG. 2(A) is employed for respective optical devices 2 and 3, and a structure in which a ceramic terminal package device shown in FIG. 2(B) is employed will be described later with reference to a first modification (FIGS. 4(A) and 4(B)). It is assumed that respective optical devices 2 and 3 employing the ceramic terminal package device are represented as optical devices 2' and 3', respectively.

Also in the present embodiment, these optical transmitting device 2 and optical receiving device 3 are fixed by a bonding agent or the like to optical device support and fixing parts 15 and 16 in which respective neck portions 2a and 3a are arranged in parallel in a receptacle part 10a so as to be fixed in the case 10 while securing the center accuracy by the necessity to secure the center accuracy (a positional tolerance not more than ±25 µm) of the optical connector interface.

In addition, the print circuit board 7 for outer connection is a compact print circuit board having a width that is slightly shorter than the width of the case 10 and a length that is very shorter than that of the conventional one, and the print circuit board 7 is positioned and fixed by a fixing screw 9 to a substrate fixing part 10b that is provided at an optical module mechanism 10 at the side of the above-described plug portion 101. In this case, also according to the present embodiment, the end portion at the side of the plug portion 101 of the compact print circuit board 7 functions as a card edge connecter part 7a to be inserted and connected into the connector interface 201a of the above-described cage part 201, and therefore, the tolerance of the outside dimension of the print circuit board is needed to be not more than ±25 µm. However, according to the present embodiment, since the print circuit board 7 smaller than the conventional one is fixed in the case 10, the positional accuracy of the case 10 and the print circuit board 7, namely, the above-described tolerance of the print circuit board can be easily realized.

In the meantime, also according to the present embodiment, in the card edge connecter part 7a, an electrode (a terminal) 7b for supplying a power source from the mother board 200 to the print circuit board 7 and for transmitting and receiving a signal between the print circuit board 7 and the mother board 200 is formed. In addition, as shown in FIG. 1(B), in order to make connection operation with respective optical devices 2 and 3 easily, it is preferable that the compact print circuit board 7 is fixed so as to be located lower than a plane including center axes of respective optical devices 2 and 3.

The flexible substrate 6 may electrically connect the above-described respective optical devices 2 and 3 to the compact print circuit board 7. According to the present invention, using a substrate with an excellent plastic property (for example, a substrate made of a polyimide resin) and connecting the above-described respective optical devices 2 and 3 to the portable print circuit board 7 on a transmission line with a predetermined impedance, deterioration of a waveform of transmitted and received signals is prevented.

Figure 3A:
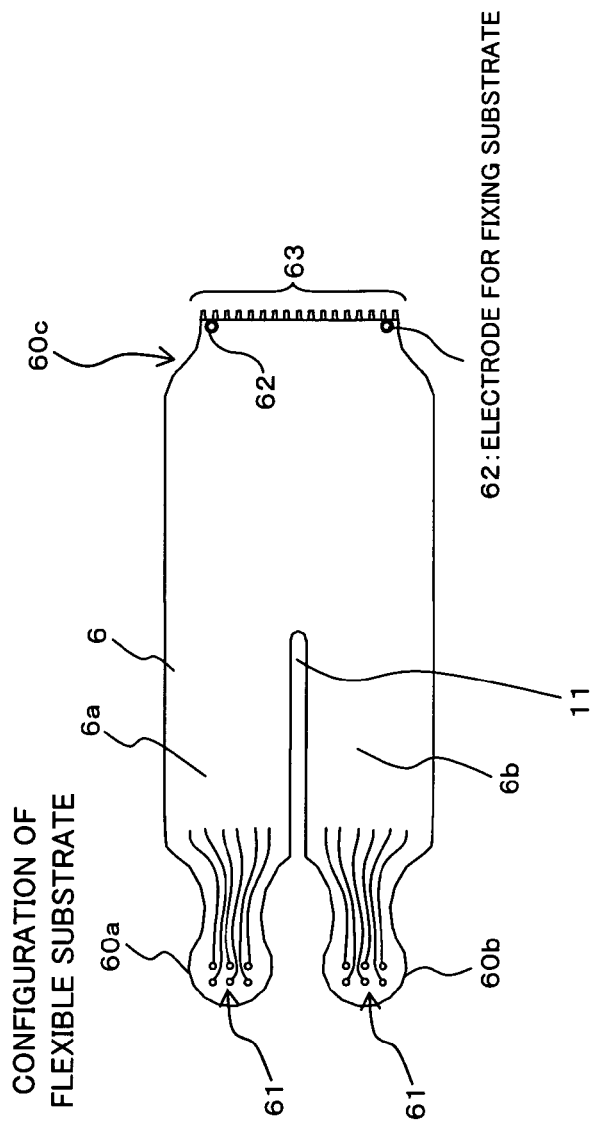
FIG. 3(A) is a schematic plan view of a flexible substrate shown in FIG. 1.

In addition, as shown in FIG. 3(A), this flexible substrate 6 is provided with a slit part 11 that is elongated in a longitudinal direction at a center portion, and thereby, one end portion is divided (branched) into two so as to construct a branch portion (a first flexible substrate part) 6a and a branch portion (a second flexible substrate part) 6b, and there are provided hole electrodes 61, which are connected by penetrating to the outer connection terminals (the lead pins) 21 of the above-described respective optical devices 2, 3, on end portions 60a and 60b of these branch portions 6a and 6b depending on the number of the above-described lead pins 21.

Then, as shown in FIG. 1(B), one branch portion 6a is connected to the optical transmitting device 2 with bent so that the lead pin 21 of the optical transmitting device 2 penetrates through the through hole electrode 61 and contacts the end surface of the optical transmitting device 2 at its surface, and in the same way, other branch portion 6b is also connected to the optical receiving device 3 with bent so that the lead pin 21 of the optical receiving device 3 penetrates through the through hole electrode 61 and contacts the end surface of the optical receiving device 3 at its surface.

Thus, by providing the slit part 11 that is elongated from an interspace between connection parts of respective optical devices 2 and 3 of the flexible substrate 6 and connecting the branch portions 6a and 6b that are divided by the slit part 11 and independent respectively to the optical devices 2 and 3, respectively, it is possible to easily absorb the positional deviation (not more than ±400 μm) between the optical transmitting device 2 and the optical receiving device 3 with a high plastic property of respective branch portions 6a, 6b. In the meantime, the length of the slit part 11 can be appropriately changed, however, if it is too short, it is difficult to correct the positional deviation in a substrate width direction and in a twist direction when connecting the branch portions 6a and 6b to the optical devices 2 and 3. Therefore, it is preferable that the length of the slit part 11 is a length for securing a plastic property so as to sufficiently and easily correct the positional property, for example, twice to three times of the substrate width of the branch portions 6a and 6b (more specifically, about 20 mm). In addition, it is preferable that the width of the slit part 11 is about 5 or 6 mm.

On the other hand, as shown in FIG. 3(A), at the side of other end portion (base portion) 60c of the flexible substrate 6, an electrode for fixing a substrate (a through hole electrode) 62 with respect to the compact print circuit board 7 and a connection electrode 63 for transmitting a signal are provided. The flexible substrate 6 is fixed to the compact print circuit board 7 by the through hole electrode 62 and is electrically connected to a ground (GND) electrode (its illustration is herein omitted) that is disposed on a rear surface of the compact print circuit board 7, and by the connection electrode 63, the flexible substrate 6 is electrically connected to a signal wiring of the compact print circuit board 7.

In addition, as shown in FIGS. 1(A) and 1(B), on the flexible substrate 6, an electronic circuit device group including a transmitting circuit (IC) 4 for the optical transmitting device 2, a receiving circuit (IC) 5 for the optical receiving device 3, and a control circuit group (an IC and a chip device) 12 necessary for transmission and reception control including these optical transmitting circuit 4 and optical receiving circuit 5 or the like is appropriately mounted. In other words, since the necessary electronic circuit device group can be mounted on the flexible substrate 6, the common difference of the outline of the print circuit board can be easily realized by making the size of the print circuit board 7 largely compact than the conventional one as the print circuit board mainly used for outer connection. Accordingly, the print circuit board 7 may have a size enough to provide the electrode 7b for the outer connection at the minimum.

However, in such an electronic circuit device group, the transmitting circuit 4 is mounted at a place where a signal transmission distance is made shorter as much as possible on the branch portion 6a to be connected to the optical transmitting device 2 of the flexible substrate 6, and the receiving circuit 5 is mounted at a place where a signal transmission distance is made shorter as much as possible on the branch portion 6b to be connected to the optical receiving device 3 of the flexible substrate 6, so that they are spaciously divided with each other by the slit part 11.

Thus, by mounting the transmitting circuit 4 and the receiving circuit 5 in the vicinity of respective optical devices 2 and 3 on the branch portions 6a and 6b of the flexible substrate 6, the optical devices 2, 3, the transmitting circuit 4, and the receiving circuit 5 can be connected by the transmission line and at the minimum distance, so that it is possible to obtain a property with little deterioration of a waveform. In addition, since the transmitting circuit 4 and the receiving circuit 5 are spaciously separated (divided) with each other by the slit part 11, it is possible to decrease the cross talk between transmission and reception via the substrate 6.

Figure 3B:
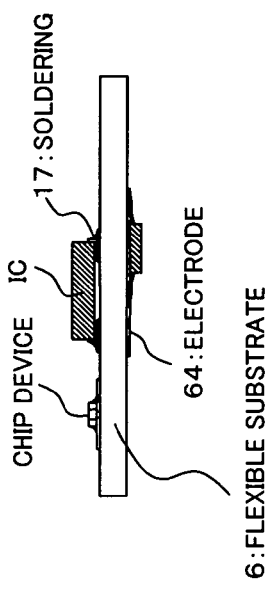
FIG. 3(B) is a schematic side view of a part where electronic circuit devices are mounted in the flexible substrate shown in FIG. 1.

In the meantime, for example, as shown in FIG. 3(B), the above-described various IC including these transmitting circuit 4 and the receiving circuit 5 are electrically connected by soldering or the like to an electrode 64 that is provided on a rear surface of the substrate 6 via a through hole of which connection terminal (a lead pin) is disposed on the flexible substrate 6 (hereinafter, it may be abbreviated simply as "a substrate 6") and various IC are fixed on the surface of the substrate 6 by soldering 17 or the like.

In addition, as shown in FIG. 1(B), the flexible substrate 6 can prevent short cut due to contact of the electronic circuit part mounted on the substrate 6 and the case 10 by sandwiching the flexible substrate 6 vertically between insulative sheets (insulating bodies) 8 such as a rubber sheet or the like and the flexible substrate 6 can increase connection strength with the optical devices 2, 3 and the compact print circuit board 7 against oscillation and impact to the XFP module 1. In addition, if a material with high heat conductivity such as a silicon rubber or the like is used as the insulating body 8, it is possible to raise a heat discharge effect of the electronic circuit device.

In the meantime, according to the above-described embodiment, the transmitting circuit 4 and the receiving circuit 5 are mounted on the branch portions 6a and 6b that are divided by the slit part 11 of the flexible substrate 6, respectively, however, any one of them may be mounted on the branch portion 6a or 6b.

(A1) A First Modification

FIG. 4 (A) is a schematic plan view showing an inner structure of the XFP module 1 when employing the ceramic terminal package device described above with reference to FIG. 2(B) as the above-described respective optical devices 2, 3. FIG. 4(B) is an A arrow side view in FIG. 4 (A). In FIGS. 4(A) and 4(B), the elements provided with the same reference numerals as the above-described reference numerals are the same as the above-described elements or the similar to them except for a special case.

As shown in FIGS. 4(A) and 4(B), when employing the ceramic terminal package device as respective optical devices 2, 3, not the through hole electrode 61 described above with reference to FIG. 3(A) but a connection electrode 64 same as the connection electrode 63 at the substrate 60c of the flexible substrate 6 is provided as end portions 60a and 60b of respective branch portions 6a and 6b of the flexible substrate 6, respectively, so that the connection electrode 64 is connected to the ceramic terminal 22 of respective optical devices 2' and 3'. Accordingly, in the case of the present embodiment, differently from the case shown in FIGS. 1(A) and 1(B), it is not necessary to connect the end surfaces 60*a* and 60*b* of the flexible substrate 6 to the end surfaces of respective optical devices 2' and 3' with bent.

Also according to the following modifications, it is possible to employ the ceramic package devices 2' and 3' as respective optical device 2 and 3, and the connection manner with the flexible substrate 6 is the same as that of the present modified embodiment.

(A2) A Second Modification

Figure 5:
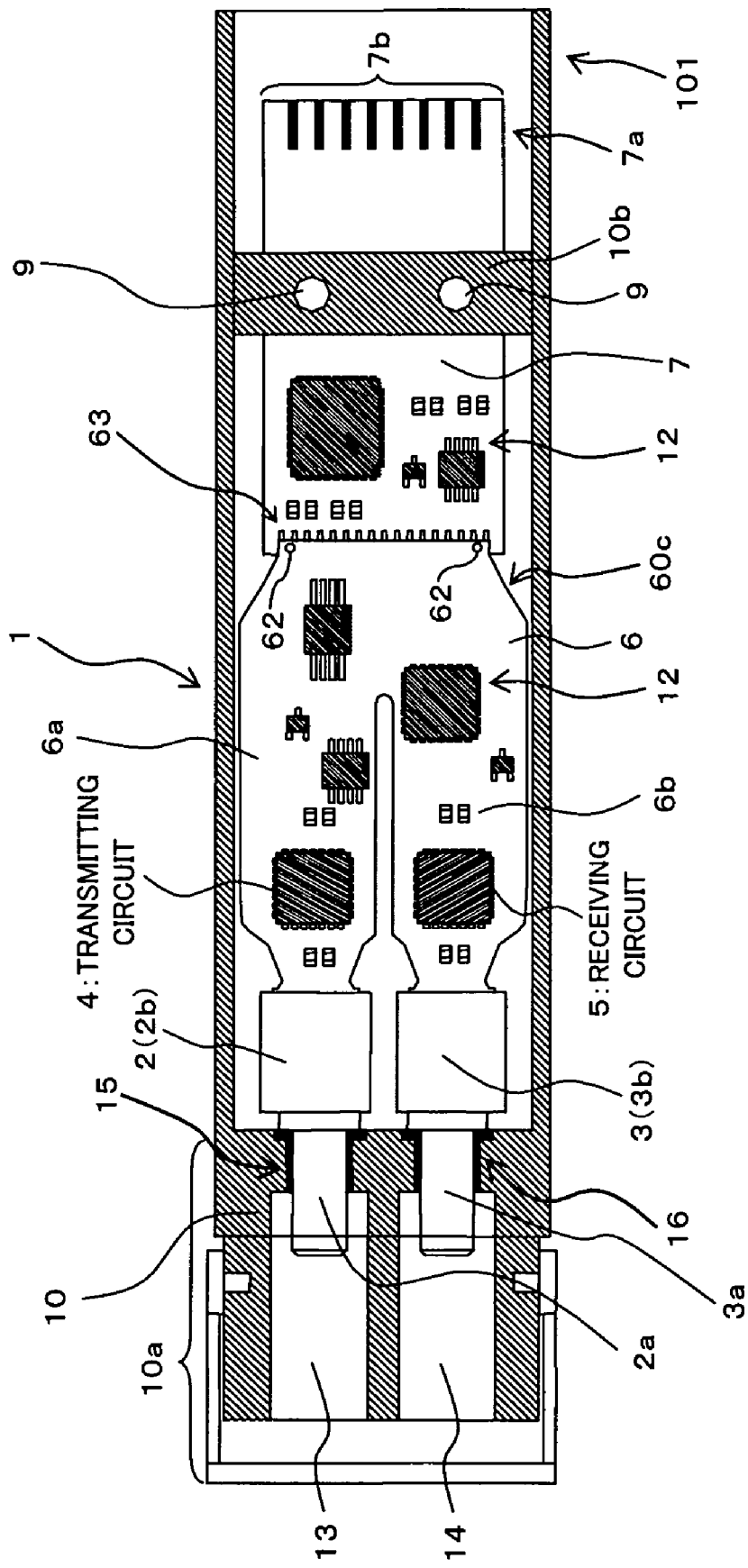
FIG. 5 is a schematic plan view showing a second modification of the XFP module shown in FIG. 1.

In addition, according to the above-described embodiment and the first modification, all electronic circuit device groups including the transmitting circuit 4, the receiving circuit 5, and the control circuit group 12 are mounted on the flexible substrate 6, however, if the positional accuracy between the case 10 and the print circuit board 6 (the common difference of the outline of the print circuit board) can be secured, for example, as shown in FIG. 5, appropriately changing the size of the print circuit board 7 appropriately, a portion of these electronic circuit device group (in the embodiment of FIG. 5, a portion of the control circuit group 12) may be mounted on the print circuit board 7.

For example, the part suitable to be mounted on the print circuit board 7 rather than the flexible substrate 6 [the part or the like that BGA (a soldering ball is mounted) is preferable] is preferably mounted on the print circuit board 7, and the electric circuit part treating a high speed signal may be mounted to be consolidated on the flexible substrate 6.

In the meantime, also in FIG. 5, the elements provided with the same reference numerals as the above-described reference numerals are the same as the above-described elements or similar to them.

(A3) A Third Modification

Figure 6:
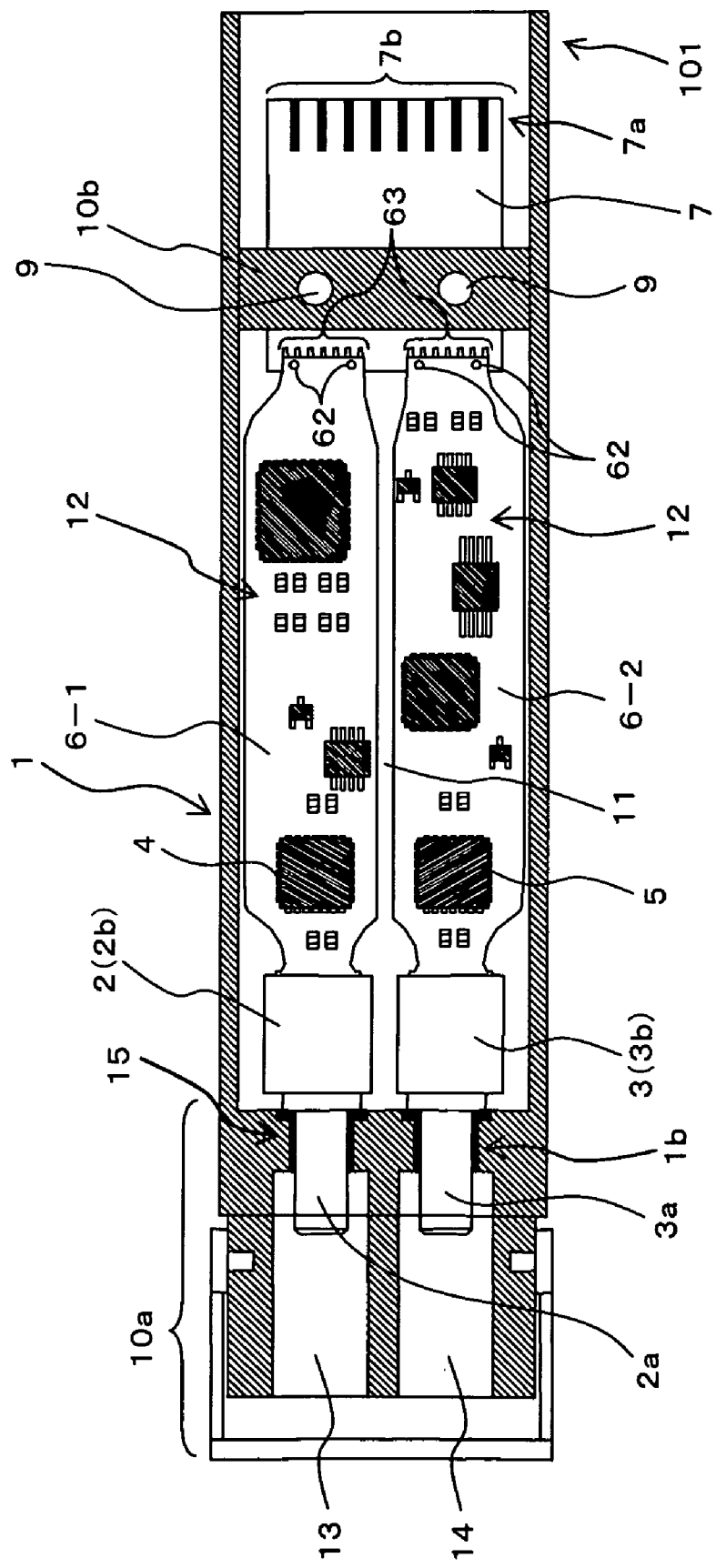
FIG. 6 is a schematic plan view showing a third modification of the XFP module shown in FIG. 1.

FIG. 6 is a schematic plan view showing a third modification of the above-described XFP module. The XFP module 1 shown in this FIG. 6 is largely different from the above-described one in that the optical transmitting device 2 and the print circuit board 7 are electrically connected by the independent flexible substrate 6-1, and the optical receiving device 3 and the print circuit board 7 are electrically connected by the independent flexible substrate 6-2, respectively. In other words, this is equivalent to that the slit part 11 is elongated to the print circuit board 7 and the flexible substrate 6 is divided into two, namely, the flexible substrates 6-1 and 6-2. Then, mounting the transmitting circuit 4 on the flexible substrate 6-1 to be connected to an optical transmission module 2, a receiving circuit 5 is mounted on the flexible substrate 6-2 to be connected to an optical transmission module 3.

Thus, by dividing the substrates mounted on the transmitting circuit 4 and the receiving circuit 5, it is possible to decrease the conventional cross talk between transmission and reception via the print circuit board. In the meantime, also in FIG. 6, the elements provided with the same reference numerals as the above-described reference numerals are the same as the above-described elements or similar to them.

(A4) A Fourth Modification

Figure 7:
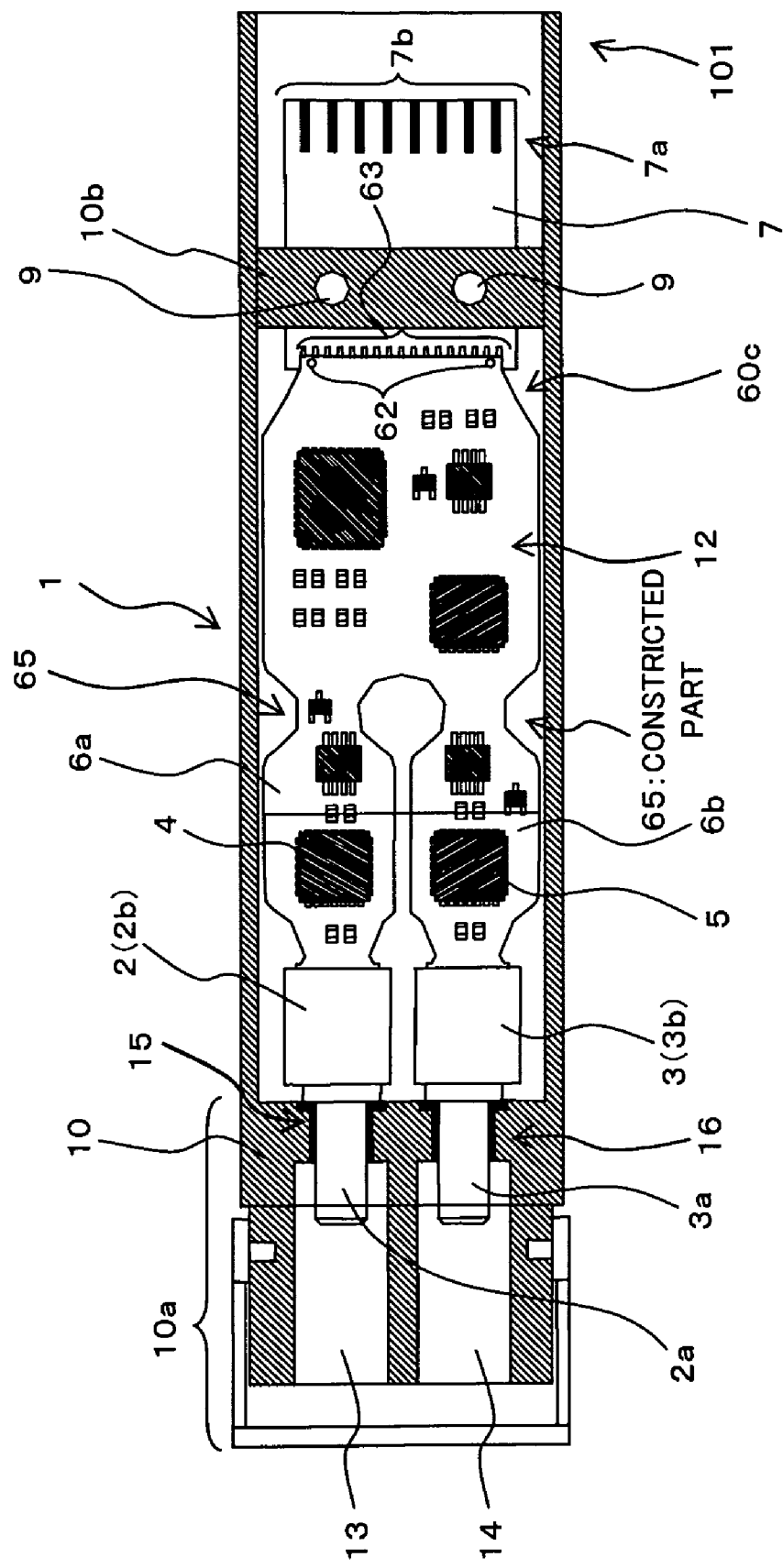
FIG. 7 is a schematic plan view showing a fourth modification of the XFP module shown in FIG. 1.

FIG. 7 is a schematic plan view showing a fourth modification of the above-described XFP module. The XFP module 1 shown in this FIG. 7 is different from the above-described one in the shape of the flexible substrate 6. In other words, parts (constricted parts) 65 with a narrow substrate (branch) width are disposed in the vicinity of the bases (divided portions) of the branch portions 6*a*, 6*b* of the flexible substrate 6, respectively. The elements provided with the same reference numerals as the above-described reference numerals are the same as the above-described elements or similar to them.

Thus, by providing constricted parts 65 in the vicinity of the branch portions 6*a*, 6*b* of the flexible substrate 6, it is possible to improve a plastic property in a twist direction at the constricted part 65, so that it is also possible to easily absorb the positional deviation in the twist direction upon connection of the optical transmitting device 2 and the optical receiving device 3, and the print circuit board 7.

Figure 8:
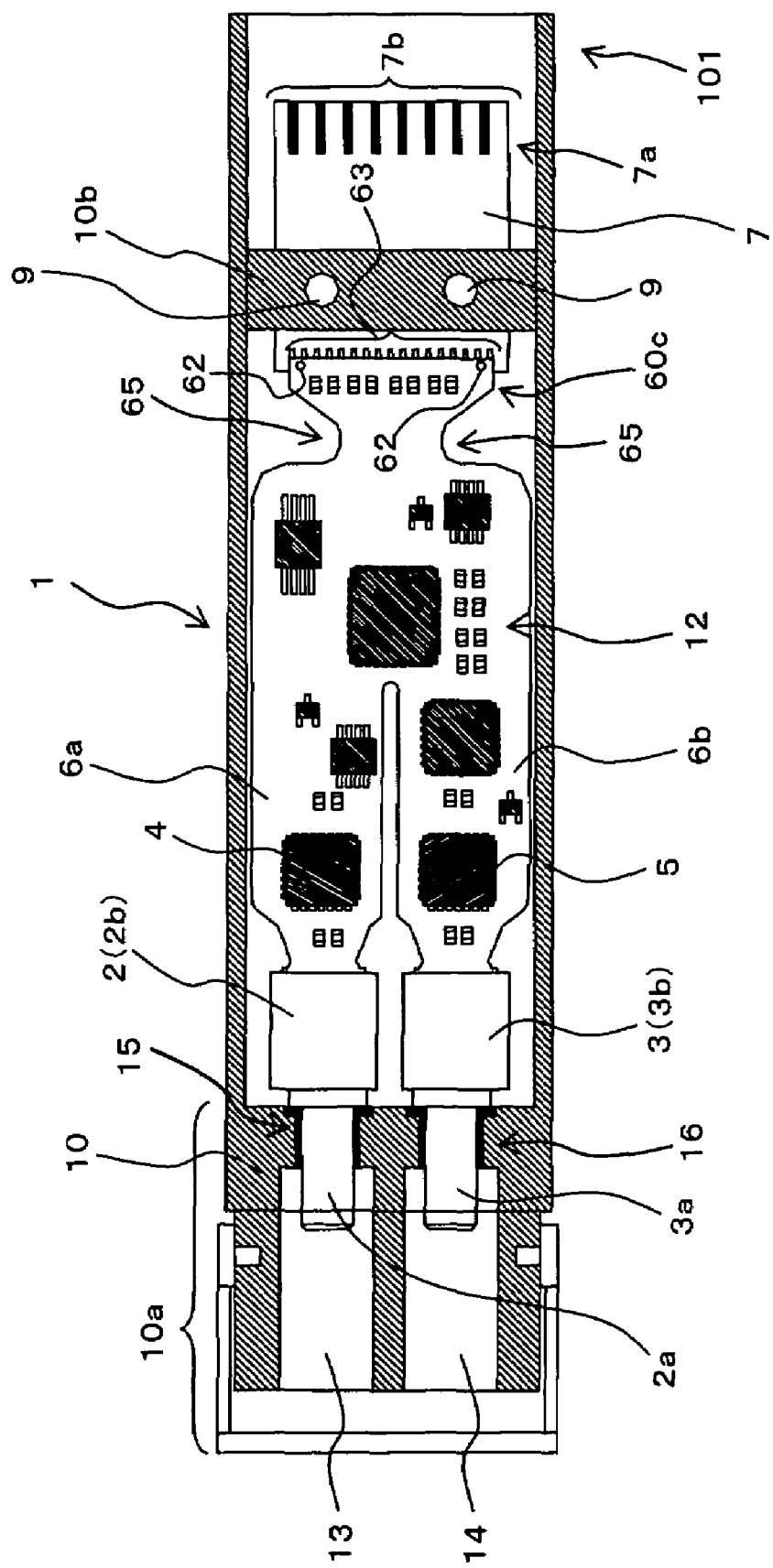
FIG. 8 is a schematic plan view showing other structure of a fourth modification of the XFP module shown in FIG. 1.

In the meantime, the constricted part 65 may be disposed at any one of the branch portions 6*a* and 6*b*. In addition, in the middle of the flexible substrate 6, basically, the constricted part 65 may be disposed at any place or may be disposed at a plurality of places. For example, as shown in FIG. 8, the constricted part 65 may be disposed in the vicinity of the connection part (the base portion 60*c*) with respect to the print circuit board 7 of the flexible substrate 6, or the constricted part 65 may be disposed in the vicinity of the branch portions 6*a*, 6*b* and in the vicinity of the base portion 60*c*, respectively. In any case, by improving the plastic property in the twist direction of the flexible substrate 6, it is possible to improve a plastic property in a twist direction at the constricted part 65, so that it is also possible to easily absorb the positional deviation in the twist direction upon connection of the optical transmitting device 2 and the optical receiving device 3, and the print circuit board 7.

(A5) A Fifth Modification

Figure 9:
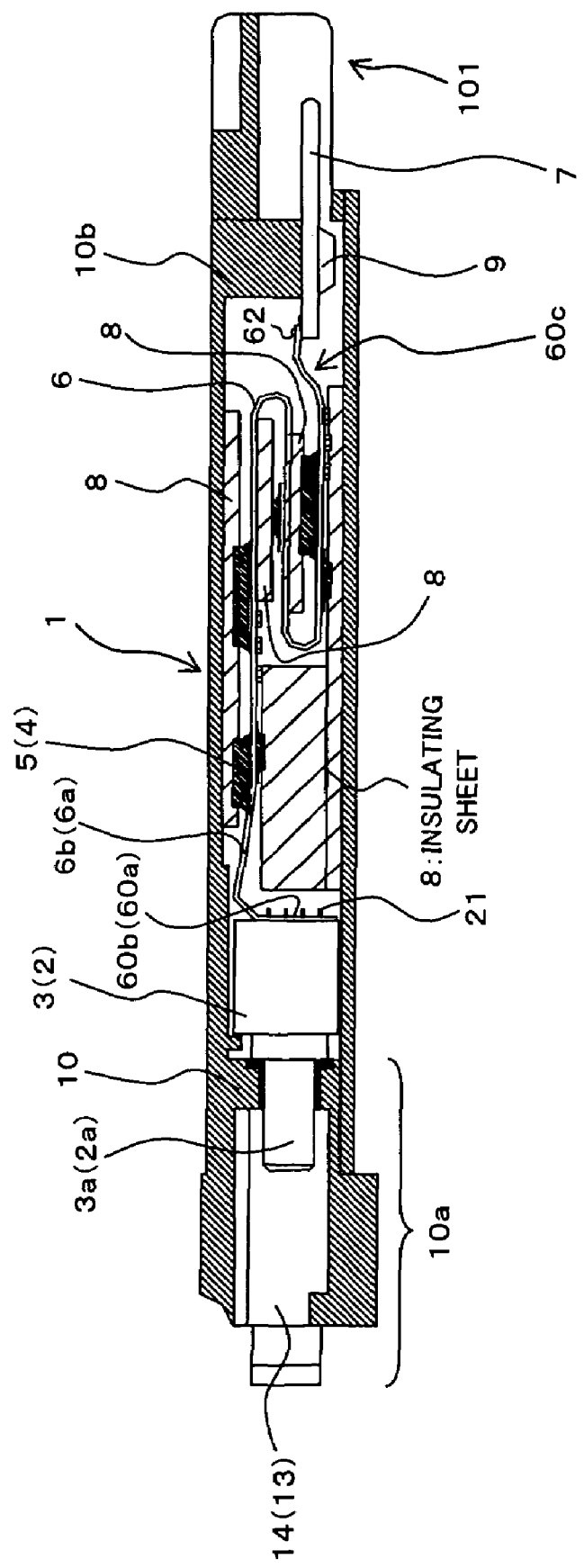
FIG. 9 is a schematic side view showing a fifth modification of the XFP module shown in FIG. 1.
Figure 11:
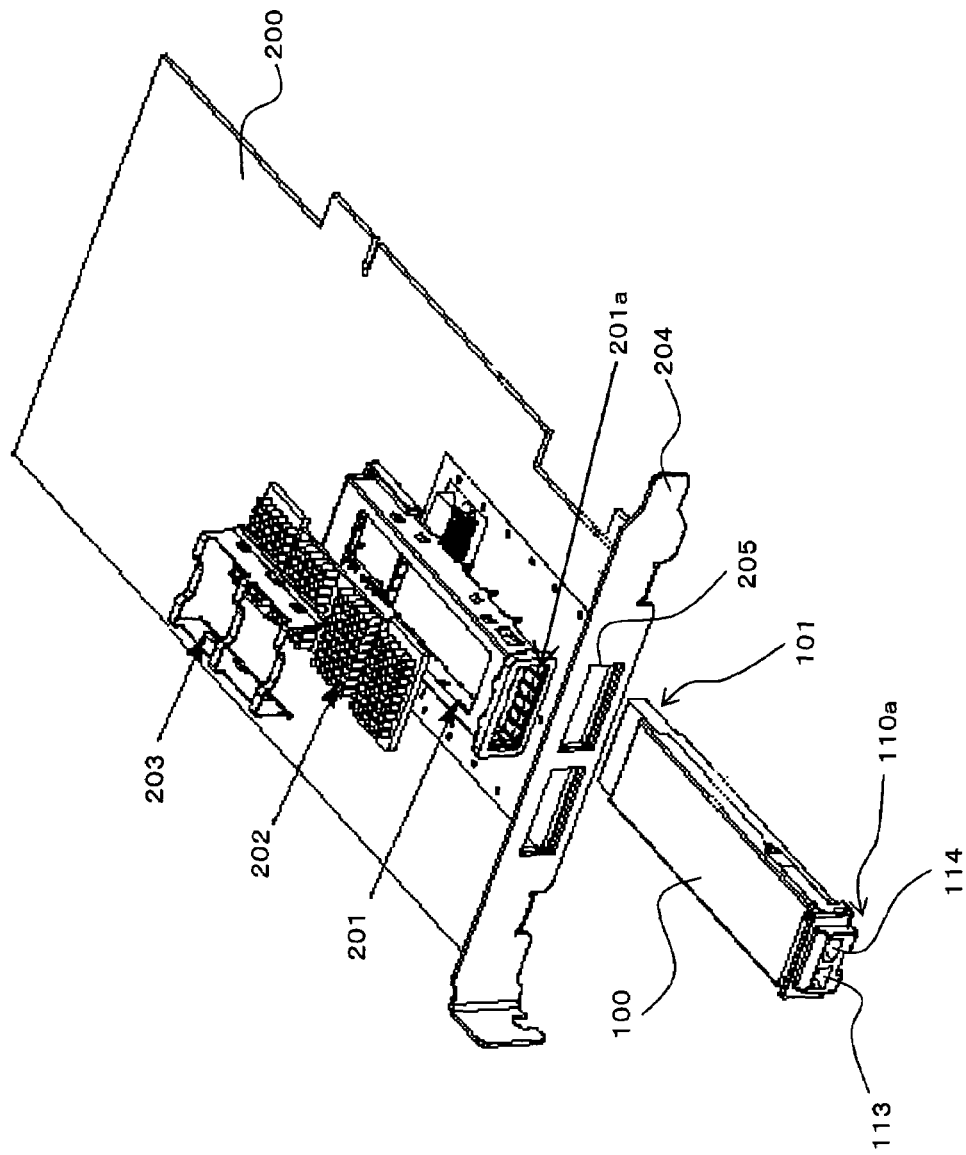
FIG. 11 is an external view of an entire XFP module in conformity with an XFP-MSA, which is one of conventional pluggable transceiver modules.

FIG. 9 is a schematic side view showing a fifth modification of the above-described XFP module. The XFP module 1 shown in this FIG. 9 is largely different from the above-described one in that the flexible substrate 6 (or respective flexible substrates 6-1, 6-2 shown in FIG. 6) is mounted with bent (folded) in the case 10, namely, the flexible substrate 6 connects respective optical devices 2, 3 to the print circuit board 7 with bent partially. In the meantime, also in FIG. 9, the elements provided with the same reference numerals as the above-described reference numerals are the same as the above-described elements or similar to them.

Thus, by mounting the flexible substrate 6 with partially bent (folded) in the case 10, the area of mounting the electronic circuit device group such as the transmitting circuit 4, the receiving circuit 5, and the control circuit 12 or the like can be made larger. Therefore, even if there are many electronic circuit device groups to be mounted, it is possible to easily mount all of the necessary electronic circuit device groups on the flexible substrate 6. However, in this case, in order to prevent short cut due to contact of the flexible substrate 6 and the case 10 or contact of the electronic circuit devices with each other, as shown in FIG. 9, it is preferable that the flexible substrate 6 is fixed by sandwiching the insulating body 8 between the upper and lower inner wall surfaces of the case 10 or in the portion where and the flexible substrate 6 are bent.

In the meantime, in FIG. 9, the flexible substrate 6 is mounted with bent in a longitudinal direction of the XFP module 1 in the case 10, however, the flexible substrate 6 may be mounted in the case 10 with bent in a lateral direction of the XFP module 1. In addition, by making the substrate width of the bent portion narrower to improve the plastic property, it may be possible to easily bend the flexible substrate 6.

In addition, the flexible substrate 6 (6-1, 6-2) to be used in the above-described embodiment and respective modifications may use a simple layer or a multi-layer as a wiring layer. If the multi-layered flexible substrate is used, it is possible to mount the electronic circuit devices more.

Then, as a matter of course, the present invention is not limited to the above-described embodiment and respective modifications and various modifications will become possible without departing from the scope thereof.

For example, specific shapes and sizes of the XFP module 1 (the optical module mechanism 10) itself and the receptacle part 10a can be changed appropriately, and the number of optical devices to be mounted may be applied to a multi-cored structure to mount three or more optical devices not limited to two of the optical devices 2 and 3 (a two cored structure). In addition, the optical devices 2 and 3 are not necessary for the optical transmission and the optical reception and they may be other optical devices.

What is claimed is:

1. An optical module, comprising:
   an optical transmitting device;
   an optical receiving device;
   a circuit board for outer connection; and
   a flexible substrate on which a part or all of an electronic circuit device group for each of said optical transmitting device and said optical receiving device is mounted to electrically connect each of said optical transmitting device and said optical receiving device to said circuit board for outer connection;
   said flexible substrate having a first flexible substrate part and a second flexible substrate part which are separated by a slit part that is elongated from an interspace between a connection part of said optical transmitting device and a connection part of said optical receiving device in a longitudinal direction of said flexible substrate, and having a third flexible substrate part which is connected to said circuit board for outer connection;
   wherein the third flexible substrate part is connected directly or indirectly to the first flexible substrate part and the second flexible substrate part, and
   said optical module further comprising:
   a transmitting circuit for said optical transmission device provided at said first flexible substrate part; and
   an optical receiving circuit for said optical receiving device provided at said second flexible substrate.

2. The optical module according to claim 1, wherein said slit part is elongated to said circuit board for outer connection so that said flexible substrate is divided into two.

3. The optical module according to claim 1, wherein a part with a narrow substrate width is provided in the middle of the flexible substrate.

4. The optical module according to claim 1, wherein a part with a narrow substrate width is provided on any one or both of said first flexible substrate part and said second flexible substrate part.

5. The optical module according to claim 1, wherein said flexible substrate is sandwiched between insulating bodies to be fixed there.

6. The optical module according to claim 5, wherein said insulating body is made of an insulating rubber.

7. The optical module according to claim 6, wherein said insulating rubber is made of a rubber with heat conductivity.

8. The optical module according to claim 1, wherein said flexible substrate connects each of the optical devices to the circuit board for outer connection with being partially folded.

9. The optical module according to claim 1, wherein said flexible substrate is configured by a multilayer flexible substrate having a plurality of wiring layers.

10. An optical module, comprising:
    an optical transmitting device;
    an optical receiving device; and
    a flexible substrate on which a part or all of an electronic circuit device group for each of said optical transmitting device and said optical receiving device is mounted to electrically connect each of said optical transmitting device and said optical receiving device to a connector part for outer connection;
    said flexible substrate having a first flexible substrate part and a second flexible substrate part that are separated by a slit part that is elongated from an interspace between a connection part of said optical transmitting device and a connection part of said optical receiving device in a longitudinal direction of said flexible substrate, and having a third flexible substrate part which is arranged at the opposite side of the side of said flexible substrate at which the first flexible substrate part and the second flexible substrate part are arranged, and
    wherein the third flexible substrate part is connected directly or indirectly to the first flexible substrate part and the second flexible substrate part; and
    said optical module further comprising:
    a transmitting circuit for said optical transmission device provided at said first flexible substrate part; and
    an optical receiving circuit for said optical receiving device provided at said second flexible substrate.

11. An optical module, comprising:
    first and second optical devices,
    a circuit board for outer connection, and
    a flexible substrate on which a part or all of an electronic circuit device group for each of said optical devices is mounted to electrically connect each of said optical devices to said circuit board for outer connection;
    said flexible substrate having a first flexible substrate part and a second flexible substrate part which are separated by a slit part that is elongated from an interspace between a connection part of said first optical device and a connection part of said second optical device in a longitudinal direction of said flexible substrate, and having a third flexible substrate part which is connected to said circuit board for outer connection;
    wherein the third flexible substrate part is connected directly or indirectly to the first flexible substrate part and the second flexible substrate part.

* * * * *